(12) United States Patent
Fujita et al.

(10) Patent No.: US 7,541,719 B2
(45) Date of Patent: Jun. 2, 2009

(54) STAGE AND X-Y STAGE EACH ON WHICH TO PLACE SAMPLE, AND CHARGED-PARTICLE BEAM APPARATUS

(75) Inventors: Masashi Fujita, Hitachinaka (JP); Shuichi Nakagawa, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 184 days.

(21) Appl. No.: 11/754,482

(22) Filed: May 29, 2007

(65) Prior Publication Data
US 2007/0295140 A1 Dec. 27, 2007

(30) Foreign Application Priority Data
May 29, 2006 (JP) .............................. 2006-148924

(51) Int. Cl.
*H01L 41/08* (2006.01)
(52) U.S. Cl. ....................................................... 310/328
(58) Field of Classification Search ................. 310/328
See application file for complete search history.

(56) References Cited

U.S. PATENT DOCUMENTS

| | | | | |
|---|---|---|---|---|
| 4,689,516 A * | 8/1987 | Yokoyama et al. | ........... | 310/317 |
| 4,798,989 A * | 1/1989 | Miyazaki et al. | ............ | 310/328 |
| 4,968,914 A * | 11/1990 | West et al. | .................. | 310/328 |
| 5,404,066 A * | 4/1995 | Moriwaki et al. | ........... | 310/328 |
| 5,907,212 A * | 5/1999 | Okada | ........................ | 310/328 |
| 6,075,311 A * | 6/2000 | Pan et al. | ..................... | 310/328 |
| 6,459,088 B1 * | 10/2002 | Yasuda et al. | .......... | 250/442.11 |
| 6,888,289 B2 * | 5/2005 | Heilig et al. | ........... | 310/323.17 |
| 2003/0173869 A1 * | 9/2003 | Kato et al. | ................... | 310/328 |

FOREIGN PATENT DOCUMENTS

JP      2004-134155 A      4/2004

* cited by examiner

*Primary Examiner*—Mark Budd
(74) *Attorney, Agent, or Firm*—Crowell & Moring LLP

(57) ABSTRACT

Provided is a stage on which to place a sample, which is capable of performing a high-precision positioning at a short time, and which prevents an image drift of a measuring object. The stage includes: a base having a guiding unit; a table which moves in a movement direction along the guiding unit; a motion unit which provides motion in the movement direction in order to cause the table to move; and a transmission unit for transmitting the motion to the table. In the stage, the transmission unit includes a table block fixed to the table, and a motion block fixed to the motion unit; and the table block and the motion block contact each other at two points forward and backward in the movement direction while in motion, and are separated away from each other while not in motion.

9 Claims, 8 Drawing Sheets

(a)

(b)

42 BACKWARD TANGENTIAL LINE
41 FORWARD TANGENTIAL LINE

STAGE AND X-Y STAGE EACH ON WHICH TO PLACE SAMPLE, AND CHARGED-PARTICLE BEAM APPARATUS

BACKGROUND OF THE INVENTION

1. Related Applications

This application claims the benefit of priority under 35 U.S.C. § 119 to Japanese patent application no. 2006-148924, filed May 29, 2006, the disclosure of which is herein incorporated by reference in its entirety.

2. Field of the Invention

The present invention relates to a charged-particle beam apparatus for inspection and monitor in the field of semiconductor device production, and particularly to a stage and an X-Y stage each on which to place a sample, and which are used for the charged-particle beam apparatus.

3. Description of the Related Art

Many of stages for measuring objects in charged-particle beam apparatuses for inspection and monitor in the field of semiconductor device production, particularly in scanning electron microscopes for inspection of semiconductor wafers are X-Y stages each having a motor as a drive source, and each configured by stacking up tables which move in their own uniaxial directions. Each of such stages is positioned in the order of microns at a high speed. For this reason, the stage needs high-precision ball screws and a no-lost-motion mechanism with which the ball screws and corresponding tables are tightly locked with each other in order that the ball screws can be free of play.

In a case where this type of no-lost-motion mechanism is employed for a stage, an image drift of a measuring object is observed when the measuring object is monitored by use of an electron microscope. This is because a ball screw which has expanded due to heat of dynamic friction generated in the ball screw while a corresponding table is moving undergoes heat shrinkage once the table stops, and accordingly moves the table again.

What is termed as a servo drive control has been proposed for the purpose of avoiding a table being moved due to heat shrinkage. The servo drive control is that for monitoring the position of a stage in real time, and thus feeding back the position to the number of revolutions of a motor to which a ball screw is connected, or the amount of deflection of an electron beam to be irradiated on the table, in accordance with heat shrinkage of the table. In addition, a gap junction control has been proposed. The gap junction control is that for positioning a table with a gap of 20 µm to 100 µm given to a junction between a ball screw and a table, thereafter mechanically separating the junction between the table and the ball screw by use of the gap, and thereby avoiding the table being again moved due to heat shrinkage. (see Japanese Patent Application Laid-open Publication No. 2004-134155, for example)

SUMMARY OF THE INVENTION

The servo drive control needs to include: a detector with a high resolution for detecting the position of the table; means which calculates the amount of re-movement of the table due to heat shrinkage on the basis of information on the position of this table; and a servo circuit for checking this amount of re-movement. This brings about a problem of making a system of the stage complicated and a problem of resultant increased costs.

The gap junction control needs to move the table not only at a high-speed but also at a low-speed in a micro-distance. For this reason, it takes time for the gap junction control to position the table. In addition, the gap junction control makes the screw ball free of play by filling the gap, when shifting from the high-speed movement to the micromovement. However, in a case where the construction of the stage in a larger scale or with multiple tables results in increased weight, a large inertial force works on the stage. This makes it difficult to stop the table while free of play. In order for this problem to be solved, the speed at which the table is moved needs to be further decreased. For this reason, it takes longer time to position the table.

The present invention aims at providing a stage, an X-Y stage and a charged-particle beam apparatus which are capable of performing a high-precision positioning at a shorter time, and which prevent an image drift of a measuring object.

The present invention which solves the problem is a stage, an X-Y stage and a charged-particle beam apparatus each including: a base having a guiding unit; a table which moves in a movement direction along the guiding unit; a motion unit which provides motion in the movement direction in order to cause the table to move; and a transmission unit for transmitting the motion to the table. The stage, the X-Y stage and the charged-particle beam apparatus are characterized in that the transmission unit includes a table block fixed to the table, and a motion block fixed to the motion unit, and in that the table block and the motion block contact each other at two points backward and forward in the movement direction while in motion, and are separated from each other while not in motion.

The present invention makes it possible to provide a stage and an X-Y stage each on which to place a sample, and a charged-particle beam apparatus, which are capable of performing a high-precision positioning at a shorter time, and which prevent an image drift of a measuring object.

DESCRIPTION OF THE PREFERRED EMBODIMENT

Descriptions will be provided hereinafter for an embodiment of a stage, an X-Y stage and a charged-particle beam apparatus according to the present invention. It should be noted that the following embodiment will be described citing an example in which a scanning electron microscope (SEM) is used as the charged-particle beam apparatus. However, the present invention is applicable not only to a SEM but also to an inspection apparatus and a measurement apparatus each using an electron beam, an ion implantation apparatus, a sputtering apparatus and etching equipment.

Figure 1:
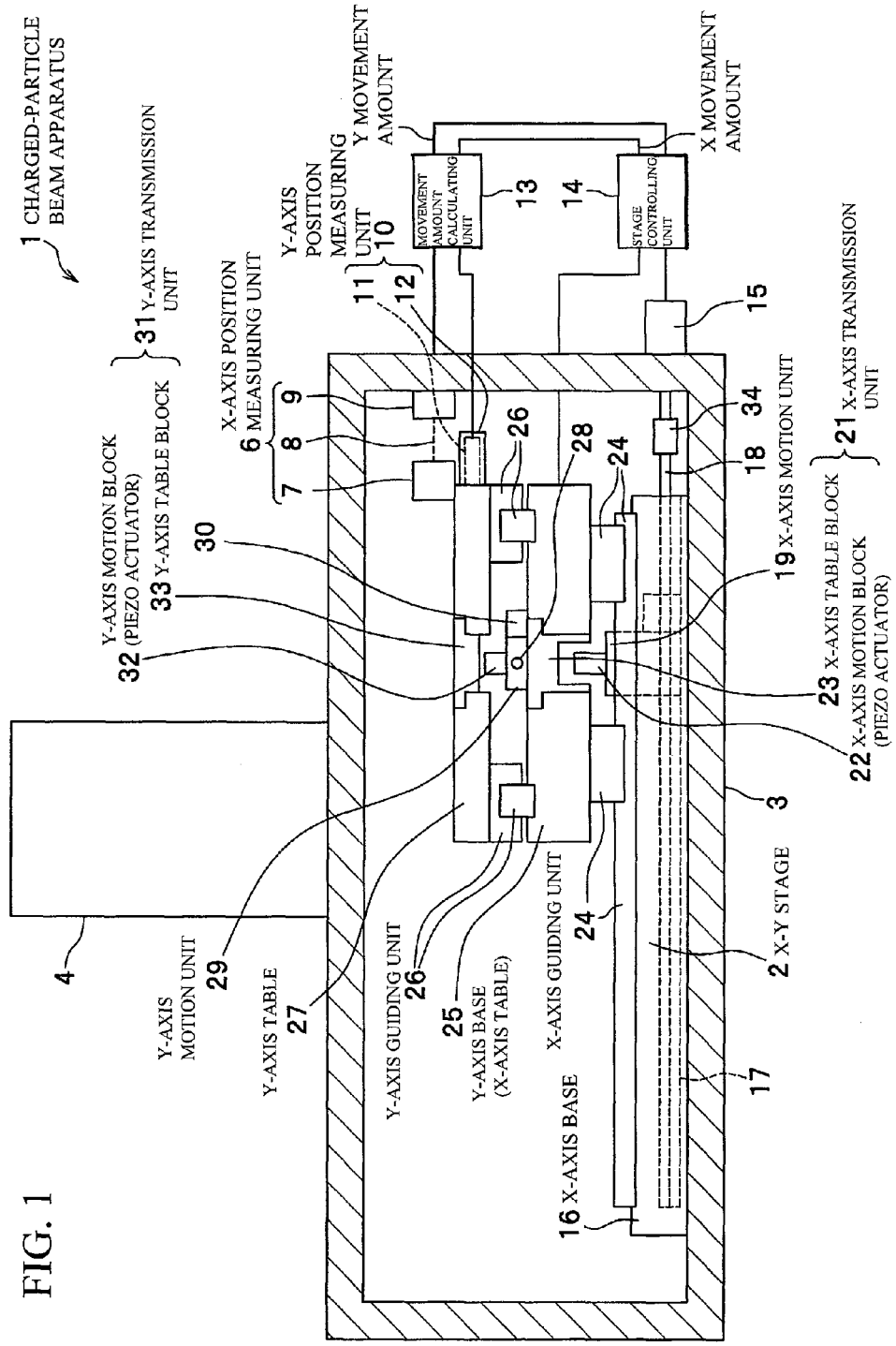
FIG. 1 is a cross-sectional view schematically showing a charged-particle beam apparatus according to an embodiment of the present invention.

As shown in FIG. 1, a charged-particle beam apparatus according to the embodiment of the present invention includes: a vacuum chamber 3; an X-Y stage 2 provided in the vacuum chamber 3; and a charged-particle beam source 4, connected to the vacuum chamber 3, for irradiating an electron beam, which is a beam of charged particles, on the X-Y stage 2.

Figure 2:
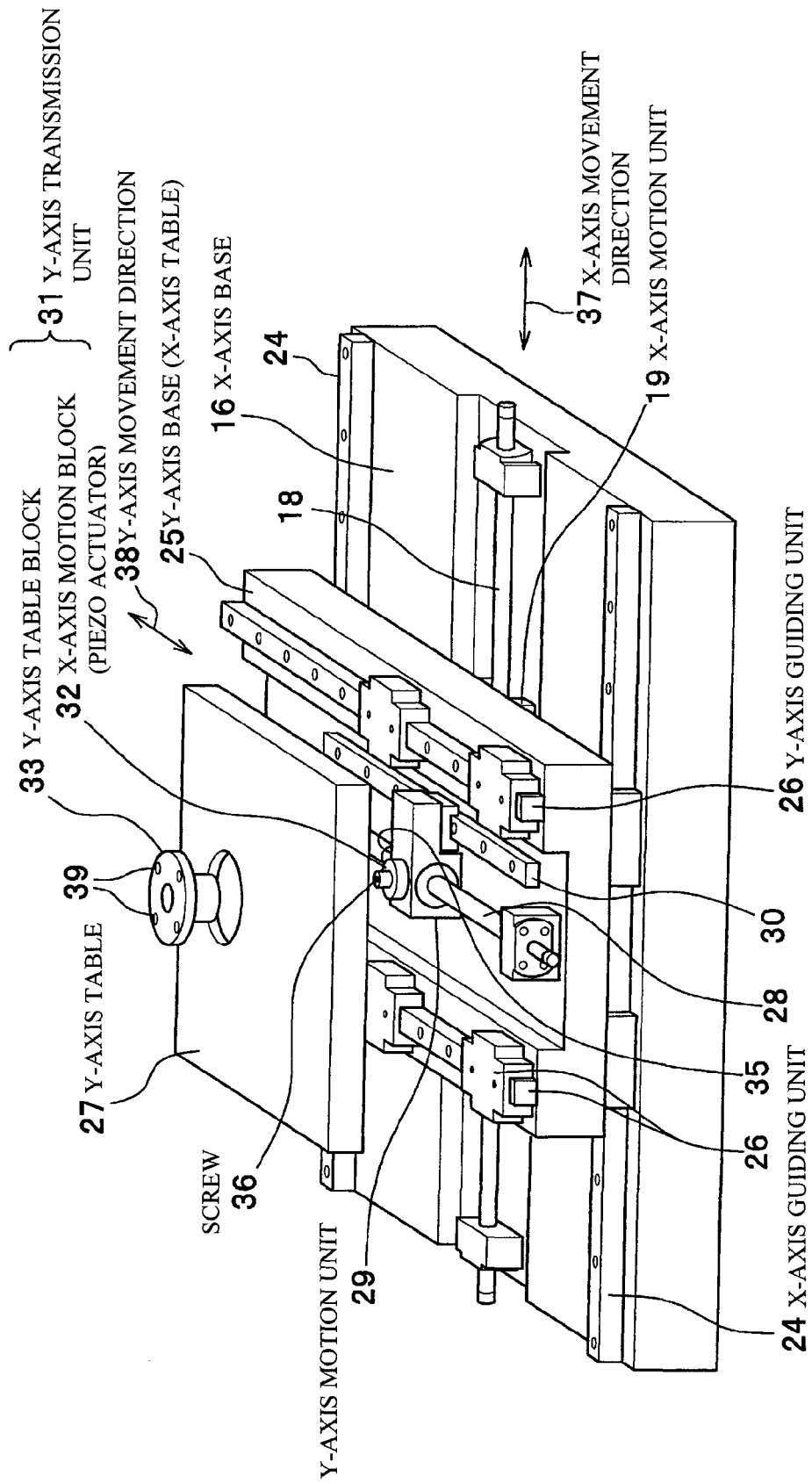
FIG. 2 is an exploded, perspective view of an X-Y stage according to the embodiment of the present invention.

As shown in FIGS. 1 and 2, the X-Y stage 2 includes: an X-axis stage in which an X-axis table 25 moves in an X-axis movement direction 37; and a Y-axis stage in which a Y-axis table 27 moves in a Y-axis movement direction 38. The X-axis movement direction 37 and the Y-axis movement direction 38 are different from each other by 90 degrees. The X-axis table 25 is concurrently used as a Y-axis base of the Y-axis stage.

In addition, the X-Y stage 2 includes: an X-axis position measuring unit 6 for measuring the current position of the X-axis table 25 in the X-axis movement direction 37; a Y-axis position measuring unit 10 for measuring the current position of the Y-axis table 27 in the Y-axis movement direction 38; a movement amount calculating unit 13 for calculating an X amount of movement from the measured current position to a target position in the X axis, and a Y amount of movement from the measured current position to the target position in the Y-axis; a stage controlling unit 14 for transmitting command signals respectively to motors 15, one for the X-axis on the basis of the X movement amount, and the other for the Y-axis on the basis of the Y movement amount. It should be noted that the stage controlling unit 14 switches modes between a separation mode and an anteroposterior two-point contact mode in an X-axis transmission unit 21 and a Y-axis transmission unit 31, which will described later. The X-axis position measuring unit 6 includes: a mirror 7 fixed to the Y-axis table 27; and a laser interferometer 9 fixed to the inner wall of the vacuum chamber 3. Thus, the X-axis position measuring unit 6 performs a position measurement by use of a laser signal 8. Similarly, the Y-axis position measuring unit 10 includes: a mirror 11 fixed to the Y-axis table 27; and a laser interferometer 12 fixed to the inner wall of the vacuum chamber 3. Thus, the Y-axis position measuring unit 10 performs a position measurement by use of a laser signal.

The X-axis stage includes: an X-axis base 16 having an X-axis guiding unit 24; an X-axis table 25 which moves in the X-axis movement direction 37 along the X-axis guiding unit 24; an X-axis motion unit 19 which provides motion in the X-axis movement direction 37 in order to cause the X-axis table to move; and the X-axis transmission unit 21 for transmitting this motion to the X-axis table 25. The motor 15 is connected to an X-axis ball screw 18 by use of a joint 34. When the motor 15 rotates, the X-axis ball screw 18 accordingly rotates as well. In response to the rotation of the X-axis ball screw 18, the X-axis motion unit 19 provides motion along an X-axis motion unit slider 17 arranged in the X-axis movement direction 37. The X-axis transmission unit 21 includes: an X-axis table block 23 fixed to the X-axis table 25; and an X-axis motion block 22 fixed to the X-axis motion unit 19.

The Y-axis stage includes the Y-axis base 25 having a Y-axis guiding unit 26; the Y-axis table 27 which moves in the Y-axis movement direction along the Y-axis guiding unit 26; a Y-axis motion unit 29 which provides motion in the Y-axis movement direction 38 in order to cause the Y-axis table to move; and the Y-axis transmission unit 31 for transmitting this motion to the Y-axis table 27. The motor, which is not illustrated, causes a Y-axis ball screw 28 to rotate. When the Y-axis ball screw 28 rotates, the Y-axis motion unit 29 provides motion along a Y-axis motion unit slider 30 arranged in the Y-axis movement direction 38. The Y-axis transmission unit 31 includes: a Y-axis table block 33 fixed to the Y-axis table by use of a threaded hole 39; and a Y-axis motion block 32 fixed to the Y-axis motion unit 29 by use of a screw 36.

Figure 3:
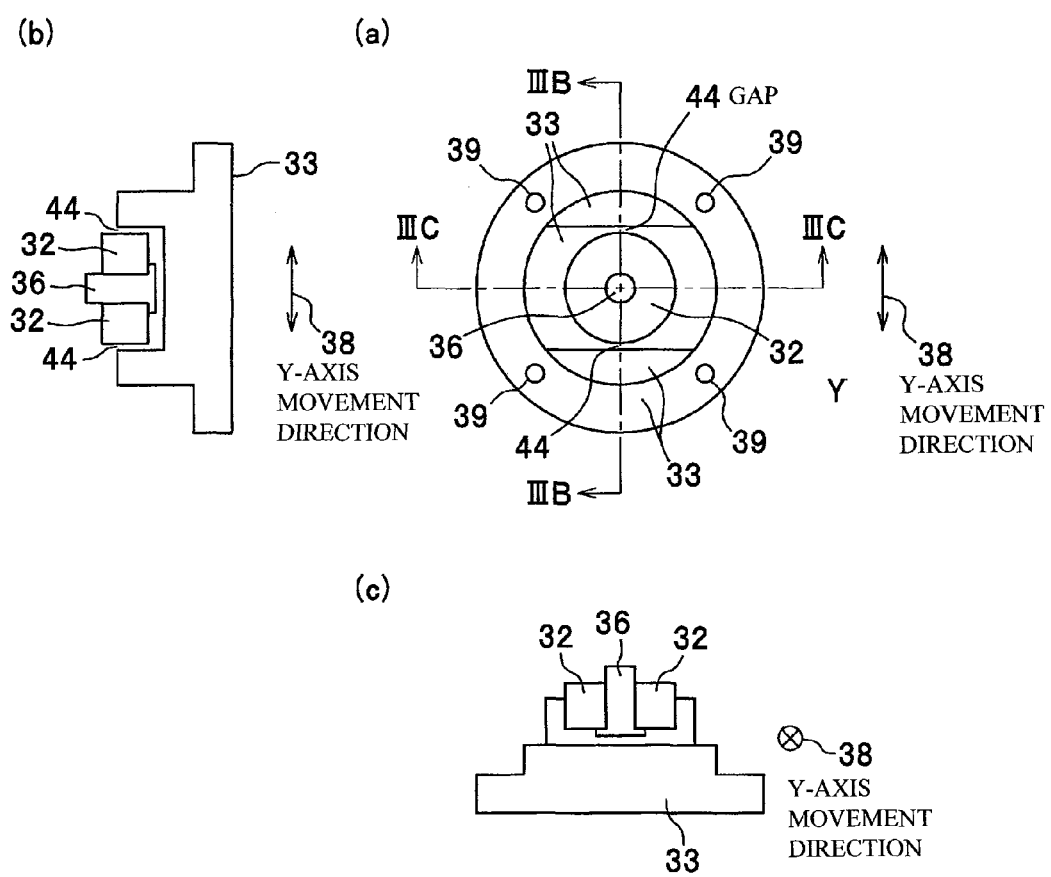
FIG. 3A is a bottom view of a transmission unit in a separation mode.
FIG. 3B is a cross-sectional view of the transmission unit taken along the IIIB-IIIB line of FIG. 3A.
FIG. 3C is a cross-sectional view of the transmission unit taken along the IIIC-IIIC line of FIG. 3A.
Figure 4:
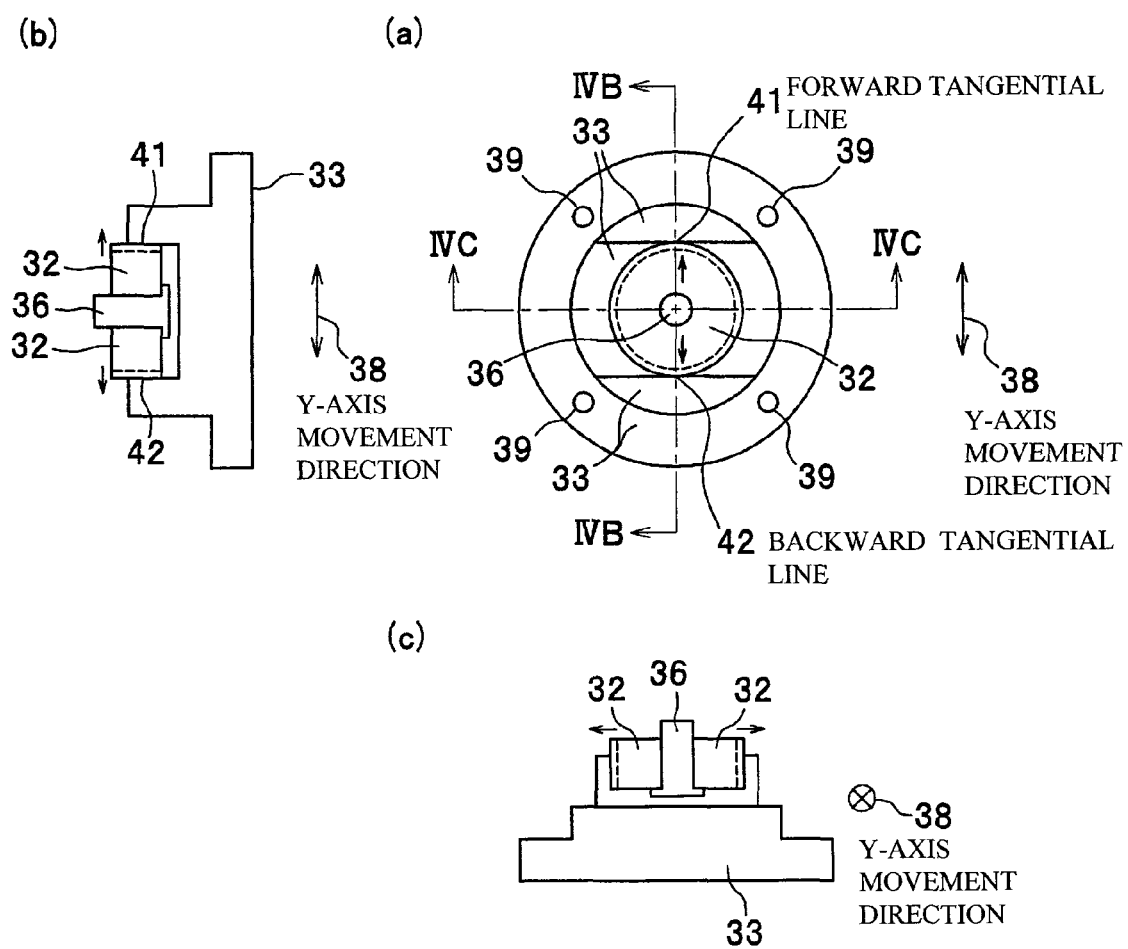
FIG. 4A is a bottom view of the transmission unit in an anteroposterior two-point contact mode.
FIG. 4B is a cross-sectional view of the transmission unit taken along the IVB-IVB line of FIG. 4A.
FIG. 4C is a cross-sectional view of the transmission unit taken along the IVC-IVC line of FIG. 4A.

The Y-axis transmission unit 31 takes a separation mode for a condition as shown in FIG. 3; and an anteroposterior two-point contact mode for a condition as shown in FIG. 4. The Y-axis motion block 32 is a cylindrical piezo actuator which is easy to attach, and which provides displacement in a diametrical direction (expands in diameter/shrinks in diameter) when a voltage is applied thereto. While in the separation mode shown in FIG. 3, this displacement causes the piezo actuator to shrink, and thus separates the Y-axis table block 33 and the Y-axis motion block 32 away from each other, hence making gaps 44 in between. While in the anteroposterior two-point contact mode shown in FIG. 4, the displacement causes the piezo actuator to expand, and thus makes the Y-axis table block 33 and the Y-axis motion block 32 contact each other on a forward tangential line 41 and a backward tangential line 42. While in the separation mode, the Y-axis table block 33 and the Y-axis motion block 32 are separated away from each other, and thus the motion of the Y-axis motion unit 29 is not transmitted to the Y-axis table 27. In other words, while in the separation mode, the Y-axis motion unit 29 and the Y-axis table 27 are disconnected from each other by the Y-axis transmission unit 31. While in the anteroposterior two-point contact mode, the Y-axis table block 33 and the Y-axis motion block 32 contact each other at two points backward and forward in the Y-axis movement direction 38, and thus the motion of the Y-axis motion unit 29 is transmitted to the Y-axis table 27. In other words, while in the anteroposterior two-point contact mode, the Y-axis motion unit 29 and the Y-axis table 27 are connected to each other by the Y-axis transmission unit 31.

A space in the Y-axis table block 33 into which the Y-axis motion block 32 is inserted, or the space between the forward tangential line 41 and the backward tangential line 42, is processed slightly smaller than a dimension which the piezo actuator takes when the maximum applied voltage is applied to the piezo actuator. The width of the piezo actuator and the space of the Y-axis table block 33 are measured by use of a precision measuring device such as a three-dimensional measuring device. In response to the difference in dimension between the width of the piezo actuator and the space of the Y-axis table block 33, an amount of displacement of the piezo actuator is determined. Thereby, the value of a voltage to be applied to the piezo actuator in each of the separation mode and the anteroposterior two-point contact mode are determined. It is desirable that these values of the applied voltages be larger values with displacement loss due to hysteresis taken into consideration.

The two planes opposite to each other in the Y-axis table block 33, between which the Y-axis motion block 33 is interposed, are parallel planes normal to the Y-axis movement direction 38. Even when, relative to the Y-axis motion block 32, the Y-axis table block 33 provides displacement in a direction at a right angle to the Y-axis movement direction 38, the Y-axis table block 33 and the Y-axis motion block 32 are capable of contacting each other on the forward tangential line 41 and the backward tangential line 42 which are located at the two points forward and backward in the Y-axis movement direction 38.

The Y-axis motion unit 29 includes a Y-axis feed nut 35 to be connected to the Y-axis ball screw 28. The Y-axis motion unit slider 30 specialized for the Y-axis motion unit 29 is attached to the Y-axis motion unit 29 so that a revolution of the Y-axis feed nut 35 should not obstruct the maintenance of a condition in which the piezo actuator and the Y-axis table block 33 make a desirable line contact with each other, and so that the Y-axis feed nut 35 should not have play in it.

The embodiment has been described citing the case of the Y-axis transmission unit 31. However, the descriptions for the Y-axis transmission unit 31 can be also used for the X-axis transmission unit 21 by replacing the Y-axis motion block 32 with the X-axis motion block 33; the Y-axis table block 33 with the X-axis table block 23; and the Y-axis movement direction 38 with the X-axis movement direction 37.

Figure 5:
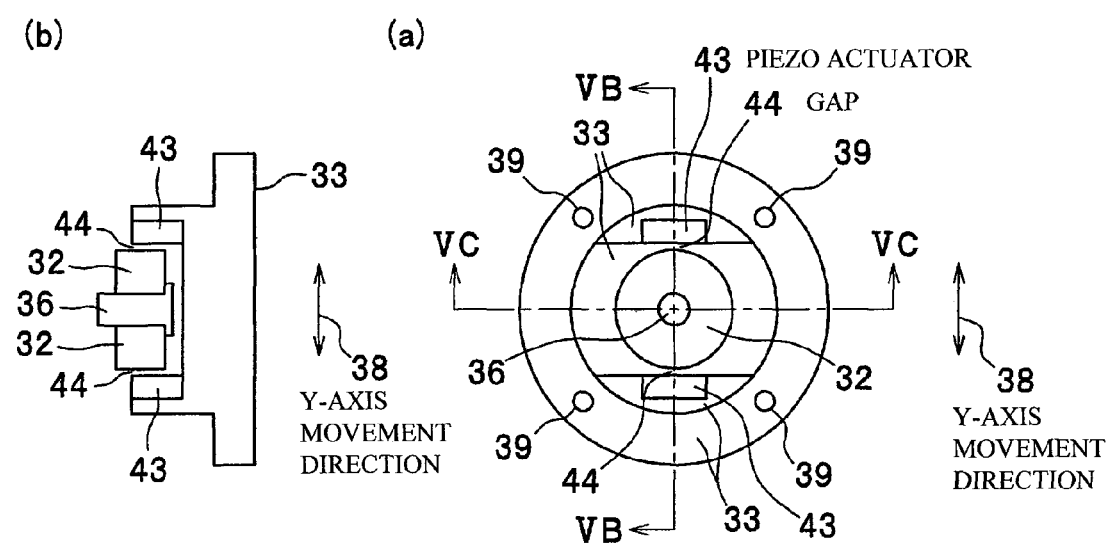
FIG. 5A is a bottom view of a transmission unit according to a modification of the embodiment of the present invention in a separation mode.
FIG. 5B is a cross-sectional view of the transmission unit taken along the VB-VB line of FIG. 5A.
Figure 6:
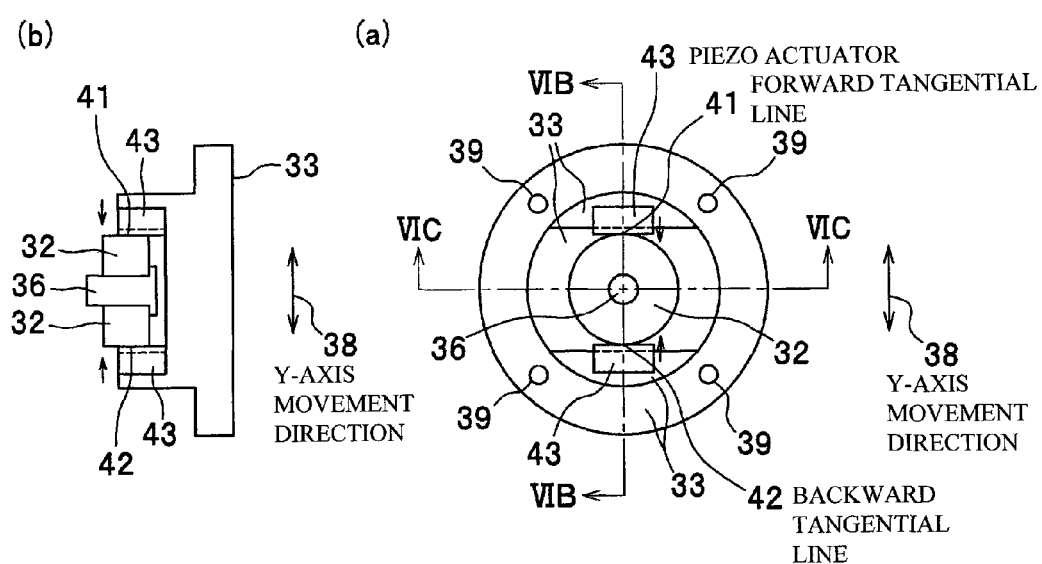
FIG. 6A is a bottom view of a transmission unit according to the modification of the embodiment of the present invention in an anteroposterior two-point contact mode.
FIG. 6B is a cross-sectional view of the transmission unit taken along the VIB-VIB of FIG. 6A.

Descriptions will be provided next for a modification of the embodiment of the present invention. As shown in FIGS. 5 and 6, a charged-particle beam apparatus 1 according to the modification of the embodiment of the present invention is different from the charged-particle beam apparatus 1 according to the embodiment in the configurations respectively of the Y-axis transmission unit 31 and the X-axis transmission unit 21, and in that no piezo actuator 43 is provided to the Y-axis motion block 32 whereas piezo actuators 43 are provided to the Y-axis table block 33 instead. The Y-axis motion block 32 is a cylindrical block which does not change in shape. Two of the piezo actuators 43 provided to the Y-axis table block 33 have their own planes which are opposite to each other in order that the Y-axis motion block 32 can be interposed between the planes. These planes are parallel planes normal to the Y-axis movement direction 38. By applying a voltage between the piezo actuators 43 opposite to each other, these planes are capable of providing displacement while in parallel to each other.

By this displacement, the Y-axis transmission unit 31 according to the modification of the embodiment is capable of taking a separation mode for a condition as shown in FIG. 5 and an anteroposterior two-point contact mode for a condition as shown in FIG. 6. While in the separation mode, this displacement separates the Y-axis table block 33 and the Y-axis motion block 32 away from each other, and thus makes gaps 44 in-between. While in the anteroposterior two-point contact mode, this displacement makes the Y-axis table block 33 and the Y-axis motion block 32 contact each other on the forward tangential line 41 and the backward tangential line 42. Because the planes are caused to provide displacement while in parallel with each other, even if, relative to the Y-axis motion block 32, the Y-axis table block 33 provides displacement in a direction at a right angle to the Y-axis movement direction 38, the Y-axis table block 33 and the Y-axis motion block 32 are capable of contacting each other on the forward tangential line 41 and the backward tangential line 42 which are located at the two points forward and backward in the Y-axis movement direction 38.

Descriptions will be provided next for a method of moving the Y-axis table 27 to a target position, or what is termed as a Y-axis stage positioning method.

Figure 7:
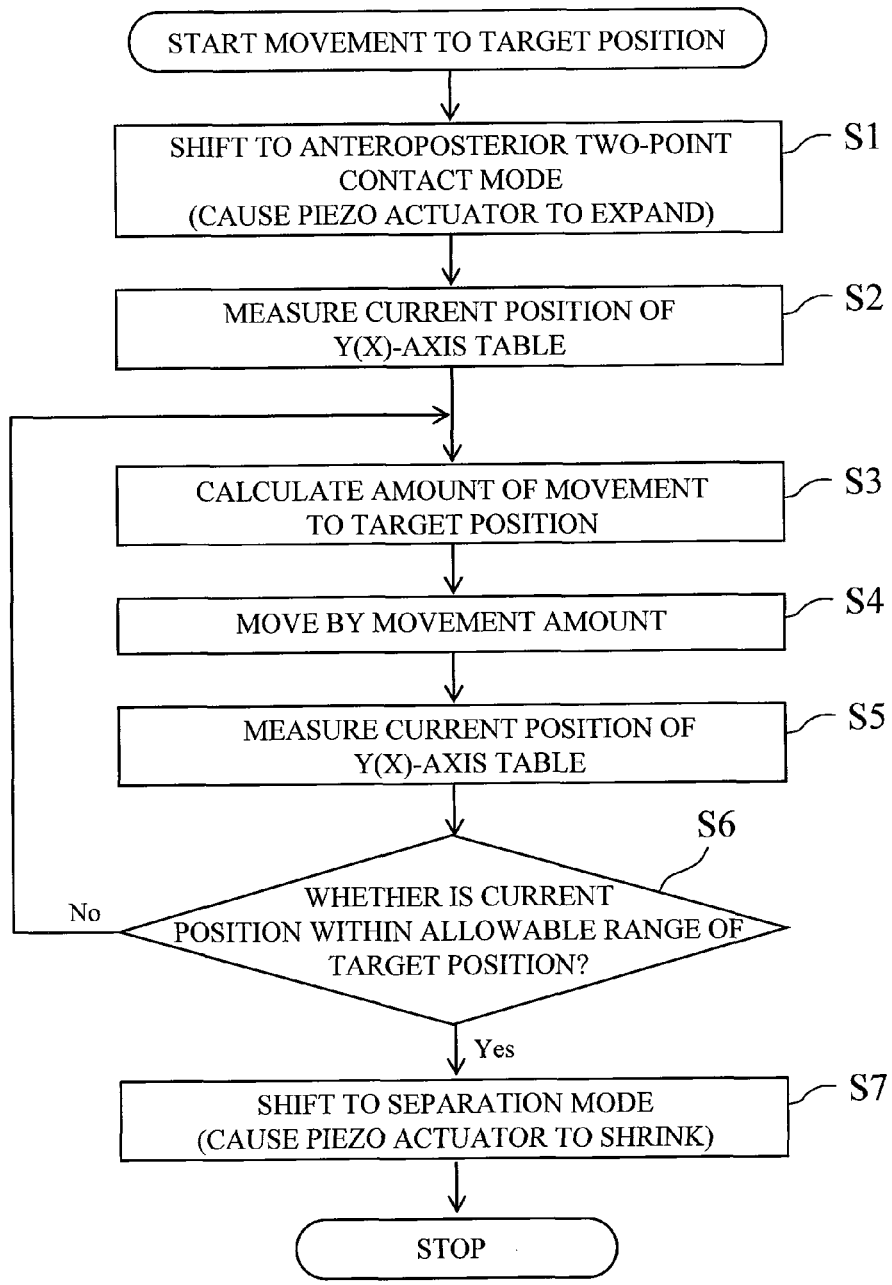
FIG. 7 is a flowchart of a movement method of moving tables of a stage according to the embodiment of the present invention to a target position.
Figure 8:
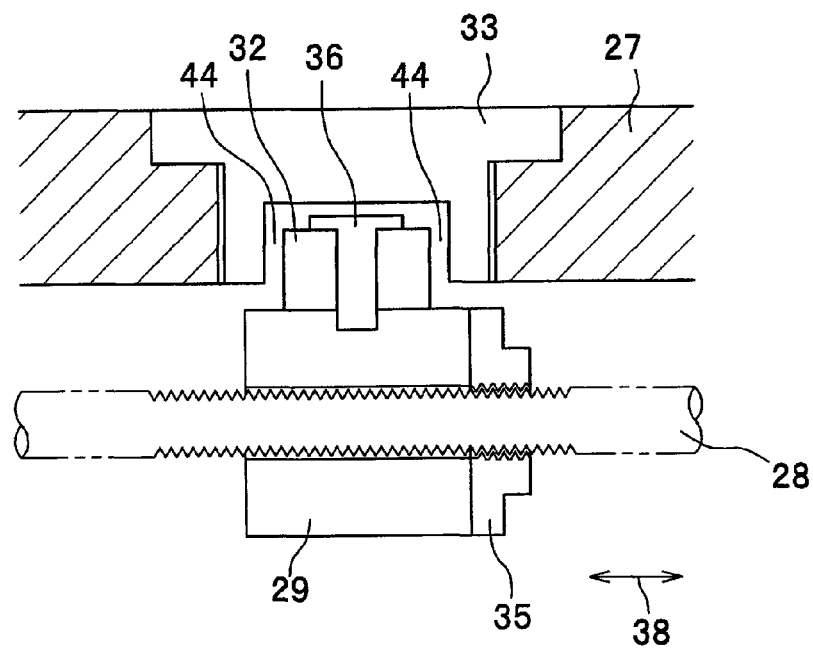
FIG. 8A is a cross-sectional view of a vicinity of the transmission unit in the separation mode.
FIG. 8B is a cross-sectional view of a vicinity of the transmission unit in the anteroposterior two-point contact mode.
Figure 8:
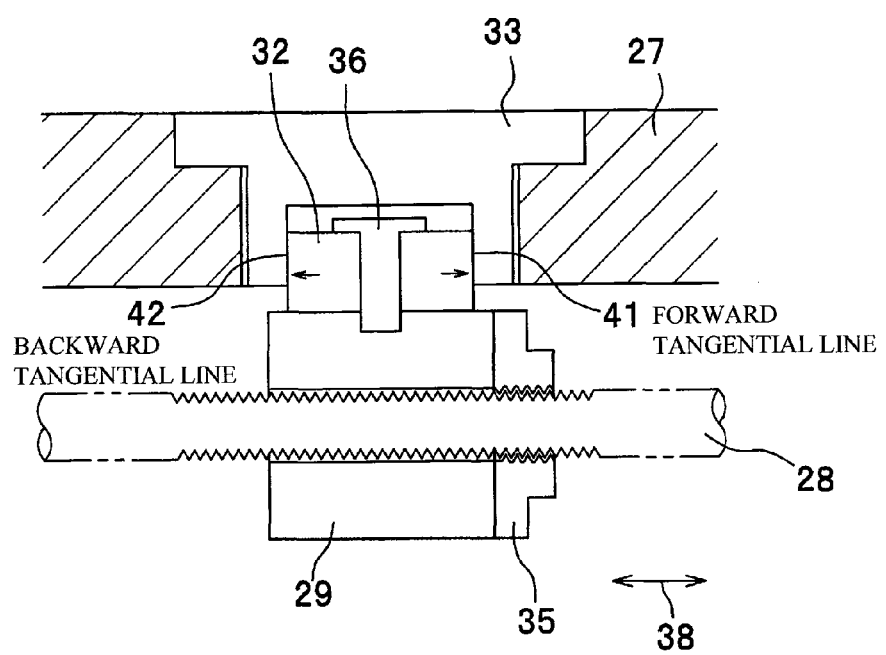

As shown in FIG. 7, in step S1, the stage controlling unit 14 applies a predetermined applied voltage for expanding the piezo actuator 32 to the piezo actuator 32, and thus causes the piezo actuator 32 to expand as indicated by change from the condition shown in FIG. 8A to the condition shown in FIG. 8B, hence shifting the piezo actuator 32 to the anteroposterior two-point contact mode. This eliminates the gaps 44 between the piezo actuator 32 and the Y-axis table block 33, and makes the Y-axis table block 33 and the piezo actuator 32 contacts each other on the forward tangential line 41 and backward tangential line 42 which are located at the two points forward and backward in the Y-axis movement direction 38. The anteroposterior two-point contact makes it possible to transmit the motion of the Y-axis motion unit 29 to the Y-axis table 27 without play.

Subsequently, the Y-axis position measuring unit 10 measures the current position of the Y-axis table 27 in step S2.

In step S3, the movement amount calculating unit 13 subtracts the measured current position from the target position, and thereby calculates the Y movement amount.

In step S4, the stage controlling unit 14 drives the motor on the basis of the Y movement amount thus calculated, and thereby causes the Y-axis table 27 to move to the target position. Specifically, a pulse motor is rotated by a rotational amount equivalent to the movement amount. The Y-axis table block 33 and the piezo actuator 32 contacts each other on the forward tangential line 41 and the backward tangential line 42 which are located at the two points forward and backward in the Y-axis movement direction 38. When the Y-axis table 27 is caused to move at a high speed, even if the high-speed movement generates a larger inertial force, the Y-axis table 27 is capable to be stopped at the target position because there is no play.

In step S5, the Y-axis position measuring unit 10 measures the current position of the Y-axis table 27.

In step S6, the stage controlling unit 14 determines whether or not the current position of the Y-axis table 27 is within an allowable range of the target position. The distance of the allowable range of the target position is set in advance. For example, the allowable range may be set at ±2 μm of the target position. If the current position of the Y-axis table 27 is not within the allowable range, the flow returns to step S3. If the current position is within the allowable range, the flow proceeds to step S7.

Finally, in step S7, the stage controlling unit 14 applies a predetermined applied voltage for shrinking the expanded piezo actuator 32 to the piezo actuator 32, and thus causes the piezo actuator 32 to shrink as indicated by change from the condition shown in FIG. 8B to the condition shown in FIG. 8A, hence shifting the piezo actuator 32 to the separation mode. This makes the gaps 44 between the piezo actuator 32 and the Y-axis table block 33, and makes the piezo actuator 32 separate away from the Y-axis table block 33. As a result, the motion of the Y-axis motion unit 29 inclusive of the image drift is not transmitted to the Y-axis table 27.

The embodiment of the present invention makes it possible to prevent re-movement of the Y-axis table 27 which would otherwise occur due to heat shrinkage of the Y-axis ball screw 28, and to position the Y-axis table 27 with a single high-speed movement thereof irrespective of the weight of the Y-axis table 27, while monitored by use of a scanning electron microscope. This makes it possible to reduce time needed for the Y-axis table 27 to move. In addition, the embodiment of the present invention makes it possible to provide a stage which prevents an image drift of a measuring object. The method of movement to the target position ends with the foregoing flow. The method of movement to the target position is applicable to the X-axis stage in common with the Y-axis stage.

What is claimed is:

1. A stage on which to place a sample, including a base having a guiding unit, a table which moves in a movement direction along the guiding unit, a motion unit which provides motion in the movement direction in order to cause the table to move, and a transmission unit for transmitting the motion to the table, wherein the transmission unit comprises:

a table block fixed to the table; and a motion block fixed to the motion unit, and wherein the table block and the motion block contact each other at two points forward and backward in the movement direction while in motion, and are separated away from each other while not in motion.

2. The stage on which to place a sample as recited in claim 1, wherein at least one of the table block and the motion block includes a piezo actuator, and displacement of the piezo actuator makes the table block and the motion block contact each other and separate away from each other.

3. The stage on which to place a sample as recited in claim 1, comprising:

a position measuring unit for measuring a current position of the table while making the table block and the motion block contact each other at the two points forward and backward in the movement direction; and a movement amount calculating unit for calculating an amount of movement from the current position to a target position, wherein the table block and the motion block is separated away from each other, after the motion unit provides motion by the amount of movement while making the table block and the motion block contact each other at the two points forward and backward in the movement direction.

4. The stage on which to place a sample as recited in claim 2, comprising:

a position measuring unit for measuring a current position of the table while making the table block and the motion block contact each other at the two points forward and backward in the movement direction; and a movement amount calculating unit for calculating an amount of movement from the current position to a target position, wherein the table block and the motion block is separated away from each other, after the motion unit provides motion by the amount of movement while making the table block and the motion block contact each other at the two points forward and backward in the movement direction.

5. An X-Y stage wherein two stages on which to place a sample as recited in claim 1 are used and superposed in a way that the movement direction of one of the two stages is different from the movement direction of the other of the two stages by 90 degrees, and in a way that the table of one of the two stages is concurrently used as the base of the other of the two stages.

6. A charged-particle beam apparatus with a stage including a base having a guiding unit, a table which moves in a movement direction along the guiding unit, a motion unit which provides motion in the movement direction in order to cause the table to move, and a transmission unit for transmitting the motion to the table, wherein the transmission unit comprises:

a table block fixed to the table;

a motion block fixed to the motion unit, and wherein the table block and the motion block contact each other at two points forward and backward in the movement direction while in motion, and are separated away from each other while not in motion.

7. The charged-particle beam apparatus as recited in claim 6, wherein at least one of the table block and the motion block includes a piezo actuator, and displacement of the piezo actuator makes the table block and the motion block contact each other and separate away from each other.

8. The charged-particle beam apparatus as recited in claim 6, comprising:

a position measuring unit for measuring a current position of the table while making the table block and the motion block contact each other at the two points forward and backward in the movement direction; and a movement amount calculating unit for calculating an amount of movement from the current position to a target position, wherein the table block and the motion block are separated away from each other, after the motion unit provides motion by the amount of movement while making the table block and the motion block contact each other at the two points forward and backward in the movement direction.

9. The charged-particle beam apparatus as recited in claim 7, comprising:

a position measuring unit for measuring a current position of the table while making the table block and the motion block contact each other at the two points forward and backward in the movement direction; and a movement amount calculating unit for calculating an amount of movement from the current position to a target position, wherein the table block and the motion block are separated away from each other, after the motion unit provides motion by the amount of movement while making the table block and the motion block contact each other at the two points forward and backward in the movement direction.

* * * * *